United States Patent [19]

O'Loughlin

[11] Patent Number: 5,319,322
[45] Date of Patent: Jun. 7, 1994

[54] ELECTRON BEAM ANTENNA MICROWAVE GENERATION DEVICE

[75] Inventor: James P. O'Loughlin, Albuquerque, N. Mex.

[73] Assignee: The United States of America as represented by the Secretary of the Air Force, Washington, D.C.

[21] Appl. No.: 541,668

[22] Filed: Jun. 11, 1990

[51] Int. Cl.$^5$ ............................................. H03B 9/02
[52] U.S. Cl. ..................................................... 331/81
[58] Field of Search ................... 331/79, 81; 315/5.29, 315/39; 313/336, 293; 330/45

[56] References Cited

U.S. PATENT DOCUMENTS

| | | | |
|---|---|---|---|
| 3,178,656 | 4/1965 | Petroff | 331/81 |
| 3,221,207 | 11/1965 | Kaufman et al. | 315/5.25 |
| 3,258,641 | 6/1966 | Petroff | 331/81 |
| 3,346,819 | 10/1967 | Birdsall | 330/45 |
| 3,484,861 | 12/1969 | Dehn | 331/81 |
| 4,596,967 | 6/1986 | Ekdahl | 331/82 |

OTHER PUBLICATIONS

H. M. Bizek, P. M. McIntyre, D. Raparia, and C. A. Swenson, "Gigatron", IEEE Transactions on Plasma Science, Apr. 1988, pp. 258-263.

*Primary Examiner*—Theodore M. Blum
*Attorney, Agent, or Firm*—Gerald B. Hollins; Donald J. Singer

[57] ABSTRACT

A high energy level arrangement for generating microwave frequency electromagnetic energy from a DC power source by way of a high energy level electron beam coupled into an output waveguide member and serving therein as an antenna source of energy for the waveguide member. The electron beam is preferably spatially and timewise modulated with sinusoids to improve conversion efficiency to dominant mode waveguide energy. The disclosure includes several embodiments including a waveform splicing arrangement and plural electron gun embodiments and discloses quantitative efficiency and operating voltage level data. Use of the invention in weaponry, radar, deep space communication and other high radio frequency level energy applications is also disclosed.

20 Claims, 4 Drawing Sheets

ELECTRON BEAM ANTENNA MICROWAVE GENERATION DEVICE

RIGHTS OF THE GOVERNMENT

The invention described herein may be manufactured and used by or for the government of the United States for all governmental purposes without the payment of any royalty.

BACKGROUND OF THE INVENTION

This invention relates to the field of efficient high-powered coherent microwave pulse radio frequency energy generators of the electron bunching type.

Heretofore, the generation of coherent microwave high-level energy from electron beams has been accomplished by bunching a high-energy electron beam and then passing the beam through a "slow wave" microwave or radio frequency structure. In this arrangement, the slow wave structure establishes a condition wherein the radio frequency field is closely coupled to the bunched beam and propagates with a velocity slightly less than the velocity of the bunched beam. Under this condition, energy is transferred from the bunched beam to the radio frequency field so that amplification or transducing of applied direct current energy into radio frequency energy occurs. Both oscillator and amplifier devices based on this arrangement exist in the art. The most common examples of this arrangement are the traveling wave tube, the Klystron and similar devices. Some of the more pronounced disadvantages attending these previous bunched beam devices include the need for precisely focused and controlled beams which are inherently limited in size and power delivery capability, the need for a complicated and delicate "slow wave" structure which is also inherently power limited, and a relatively narrow operating bandwidth—typically on the order of a few percent—a bandwidth limitation imposed by the physics of the slow wave structure.

The patent art includes several examples of microwave generating apparatus that are of general interest with respect to the present invention. Included in these are the U.S. Pat. No. 3,178,656 of M. D. Petroff which concerns a microwave amplifying and generating apparatus employing beam bunching and Cerenkov radiation concepts to generate microwave energy—energy in the relatively low power range of seven watts.

The U.S. Pat. No. of I. Kaufman et al, U.S. Pat. No. 3,221,207, also discloses a microwave power generating apparatus, a device of the electron beam variety wherein the electromagnetic deflection of an electron beam into different portions of a waveguide element is used as the microwave energy generating mechanism. The Kaufman invention refines this general concept into a more efficiently controlled arrangement which includes post deflection acceleration of the electron beam and improved beam timewise utilization.

In the patent of C. A. Ekdahl, U.S. Pat. No. 4,596,967, a relativistic electron beam is converted into high-power microwave emission using the Cerenkov radiation related Smith-Purcell effect in combination with a stainless steel azimuthally-slotted cylindrical grating and a copper optical torrodial resonator combination wherein the transmission grating provides signal feedback to accomplish beam bunching and high gain.

SUMMARY OF THE INVENTION

In the present invention, a sheet electron beam which includes both sinusoidal spacial distribution and sinusoidal temporal intensity modulation is coupled into a precisely defined location of a waveguide member in order that $TE_{01}$ mode energy be generated in the waveguide. An output radio frequency waveform which may include both a reflected and reversed $TE_{01}$ mode component in combination with a directly couple $TE_{01}$ mode component or plural directly coupled $TE_{01}$ mode components is achieved. The invention contemplates generation of the sheet electron beam using either solid state, plasma, or thermionic grid modulated sources and includes alternate waveguide and sheet electron beam source arrangements.

It is an object of the invention, therefore, to provide a high-power microwave energy source.

It is another object of the invention to provide a high-power microwave energy source in which a high-energy modulated electron beam functions as antenna within a waveguide member in order to provide microwave energy to the waveguide.

It is another object of the invention to build the waveform of a microwave energy output signal from a plurality of coherent waveform components.

Additional objects and features of the invention will be understood from the following description and the accompanying drawings.

These and other objects of the invention are achieved by microwave energy generation apparatus comprising; means for generating a high energy level sheet electron beam of predetermined lateral density profile; means for timewise additionally varying the electron density of said laterally profiled sheet electron beam in response to a time-dependent pulse modulation signal; microwave waveguide means including a reflection node short circuit portion and input port means disposed in predetermined separation therefrom for receiving said profiled and pulse modulation sheet electron beam there into, said waveguide means emitting sheet electron beam sourced microwave radio frequency energy having waveform components received directly from said input port means and also via said reflection node short circuit portion, from said input port means.

DETAILED DESCRIPTION

Figure 1:
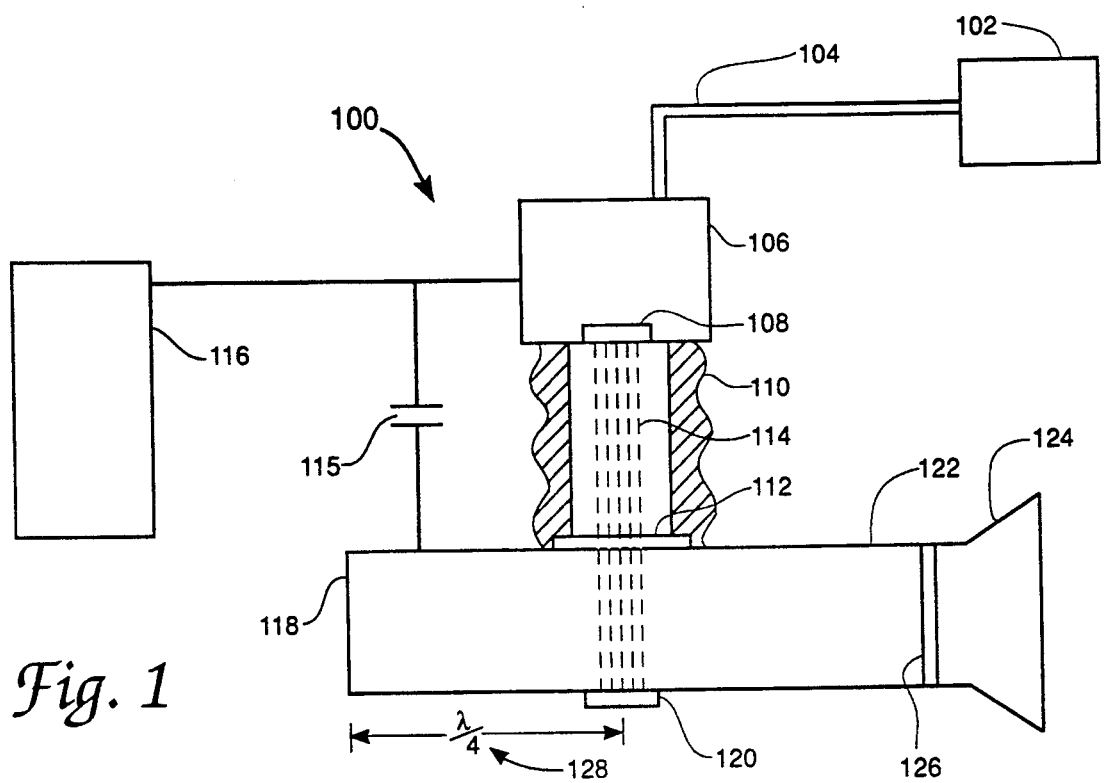
FIG. 1 in the drawings shows the major components of one arrangement for a microwave energy source according to the invention.

FIG. 1 in the drawings shows an embodiment of the present invention useful for generating microwave radio frequency energy in the megajoule per pulse range of energy levels. Apparatus of the FIG. 1 type may be useful for radio frequency weapons as well as for deep space radar and communications uses. The FIG. 1 microwave generating apparatus 100 is comprised of a waveguide member 122 into which is received a sheet electron beam 114 that originates in the electron beam gun apparatus 106 and is conveyed between the gun apparatus 106 and the waveguide member 122 by the insulating vacuum enclosure 110.

The electron beam gun apparatus 106, as is described more completely below, generates a high energy level sheet electron beam which has a particular lateral electron density profile. This electron beam is also pulsed in amplitude in response to pulse signals received along the communicating path 104 from a radio frequency master oscillator circuit 102. Energy appearing in the sheet electron beam 114 originates in a pulse power source 116 and is stored in the by-pass capacitor 115. The pulse power source 116 may provide an output voltage in the range of 500 kilovolts and 2000 amperes for a duration of five microseconds, for example The electron beam gun 106 in the FIG. 1 apparatus includes a gridded cathode 108 which may be of the thermionic, plasma, solid state, or other known electron sourcing types. The gun apparatus 106 also includes a radio frequency grid driver apparatus, an apparatus that is controlled by a signal received from the radio frequency master oscillator circuit 102 by way of the communicating path 104. The communicating path 104 is preferably arranged in the form of an optical signal conveying link, such as a fiber optic coupling, in order to avoid insulation and electrical breakdown problems associated with the 500 kilovolt operating potential of the electron beam gun apparatus. The vacuum enclosure 110 in FIG. 1 includes an electron beam window 112 by which the sheet disposed electron beam 114 is admitted into the waveguide 122. Disposed opposite the electron beam window is a beam dump energy absorbing member 120 which is made capable of absorbing and dissipating portions of the sheet disposed electron beam 114 that are not converted into radio frequency electromagnetic field energy in the waveguide 122.

At one end of the waveguide member 122 is located a radio frequency short circuit apparatus 118, this short circuit apparatus being located at a distance of one quarter wavelength from the center of the electron beam 114 as is indicated at 128 in FIG. 1. The waveguide 122 in FIG. 1 includes a vacuum window 126 in order that the waveguide interior may be maintained in a near vacuum condition for efficiently converting the energy of the electron beam 114 into radio frequency energy. The radio frequency energy generated in the waveguide 122 may be connected to a variety of transmission or utilizing devices as are typically represented by the radiating horn 124.

The underlying operating concept of the FIG. 1 embodiment of the invention is based on employing a high-energy modulated electron beam as an antenna which radiates radio frequency energy directly into the waveguide transmission line. The mathematical basis for this operating concept is outlined in the equations shown in Appendix A herein which should be considered together with the representation of sheet current in a rectangular waveguide shown in FIG. 7 of the drawings. Additional information concerning the conversion of energy from a profiled sheet electron beam into electromagnetic energy within a waveguide is to be found in the several published textbooks concerned with the theory of waveguide operation and electromagnetic fields generated within a waveguide. One such textbook is titled "Time Harmonic Electromagnetic Fields" by R. F. Harrington which is published by McGraw Hill Incorporated.

Background discussion of waveguide modes is to be found in the textbooks "Antenna Engineering" authored by R. C. Johnson and H. Jasik, second edition, also published by McGraw Hill Incorporated, especially in chapter 42, and in the text "Electronic and Radio Engineering" authored by Fredrick E. Terman, also a McGraw Hill Incorporated publication, especially in chapter 5. The textbook "Principles and Applications of Waveguide Transmission" authored by J. C. Southworth and printed by D. Van Nostrand Company and the text "Field and Wave Electro Dynamics" by C. C. Johnson also published by McGraw Hill are additionally informative on this subject. The contents of these several textbooks are hereby incorporated by reference herein.

Implementing the modulated electron beam antenna in a waveguide concept preferably requires the generation of a sheet electron beam having a lateral electron density profile that is readily converted into the predominant $TE_{01}$ mode energy form in the waveguide. This sheet electron beam also includes a modulation component at the waveguide output frequency. This sheet beam is passed into the waveguide where it becomes a source or antenna which radiates or causes the propagation of radio frequency energy in the waveguide.

The generation of broad area electron beams of the type required for this use is a well-developed technology which has been previously used in chemical excimer lasers and other types of gaseous lasers. Magnetic fields may be used to shape and improve the quality of the sheet electron beam and radio frequency modulation can be accomplished by a grid control element in combination with conventional thermionic vacuum tube technology or more advantageously with the newer gated field emission cathode—a device which is briefly described in the article titled "Gigatron" appearing in the "IEEE Transactions on Plasma Science," April 1988, pages 258-263 and authored by Hana M. Bizek, Pete M. Mcintyre, Deepak Raparia, and Charles A. Swenson. The contents of the Bizek et al article are also hereby incorporated by reference herein. Additional information sources concerning the gated field emission cathode are also identified in the Bizek et al article.

Although the sinusoidally profiled sheet of electrons is preferred for the beam of the present device, it is found that departure of the sheet current amplitude from a sine profile will have the principal result of generating higher order TE modes of radio frequency energy in the waveguide of the invention. The overall efficiency of the microwave generating apparatus will be degraded by only about 36% even if the beam current sheet is rectangular instead of sinusoidal in profile, for example. Initial evaluation embodiments of the invention therefore may be fabricated with only minimum concern for the electron beam lateral profile and then refinement techniques which are known in the art utilized to increase the device operating efficiency through more desirable profiling.

In a similar manner, if the time waveform of the sheet current contains harmonic distortion, the result will be both harmonic and higher order TE mode energy in the radio frequency output of the apparatus. It is therefore to be understood that the dispersed $TE_{01}$ mode power at the fundamental frequency of the waveguide is directly relatable to the sheet current power content of the spatial dimension sinusoidal component and the corresponding fundamental power content of the sinusoidal time wave.

Operation of the FIG. 1 apparatus commences with application of a five microsecond high voltage pulse from the power source 116 to the electron beam gun cathode 108 and the parallel connected capacitor 115. At the same time, the master oscillator 102 provides a drive signal through the fiber optic communicating path 104 to the radio frequency grid portion of the electron beam gun apparatus 106. The output of the radio frequency grid driver modulates the grid of the cathode which produces a modulated beam of electrons with preferably a half sine profile at 500 megahertz. The beam electrons are accelerated by the 500 kilovolts potential provided to the cathode from the pulse power source 116. The resulting high-energy electron sheet disposed beam 114 passes through the electron beam window 112 into the waveguide 122 where it generates two radio frequency TE waves, preferably $TE_{01}$ mode waves.

Figure 2:
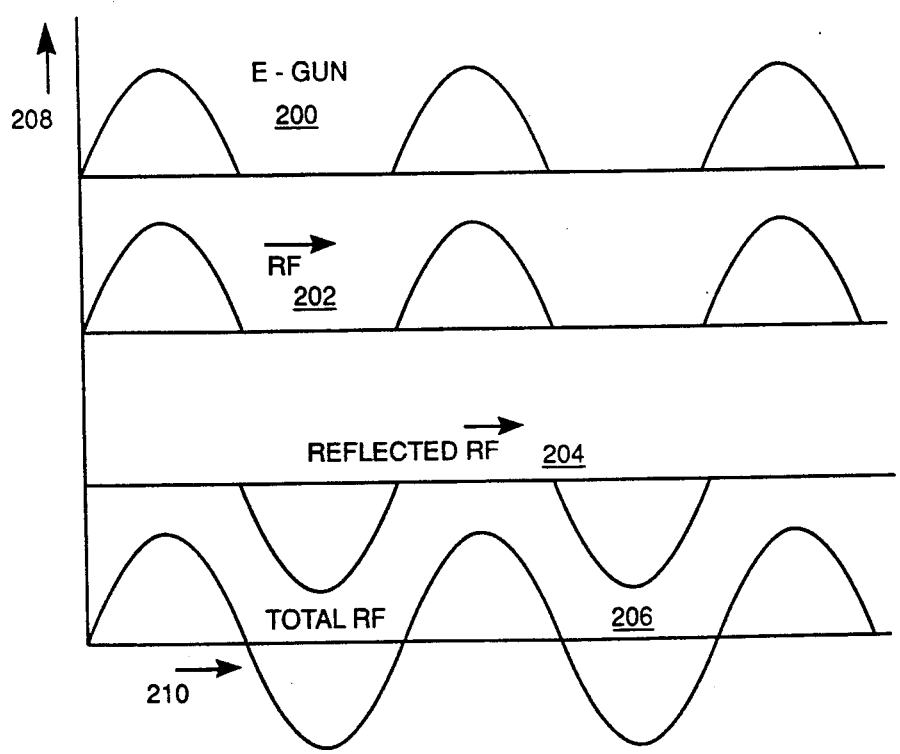
FIG. 2 shows signal waveforms relating to the FIG. 1 apparatus.

These TE waves which are represented in FIG. 2 travel in opposite directions in the waveguide 122 with each wave having the same polarity as they depart the sheet beam source. The leftward traveling wave however, strikes the waveguide short circuit apparatus 118 and reverses its direction of travel. Because of the one quarter wavelength separation between the short circuit apparatus and the sheet beam center, this reflected wave arrives at the sheet beam location delayed by one half wavelength in time. The reflected wave therefore continues propagating to the right as the missing opposite or lower half of the second radio frequency wave sinusoid which is also traveling to the right. Both halves of the wave enter the load which is represented by the radiant horn 124.

The FIG. 1 apparatus may be described quantitatively with the mathematical analysis presented below. In this analysis, the operating frequency of the microwave source is presumed to be 500 megahertz and the waveguide cut off frequency is presumed to be 353 megahertz. Under these conditions, the waveguide characteristics impedance is given by the relationship:

$$Zo = eta/[1-f_c/f)^2]^{\frac{1}{2}} = 435 \text{ ohms} \qquad (1)$$

where Zo=characteristic waveguide impedance
eta=characteristic impedance of free space (377 ohms)
$f_c$=cut-off frequency (353 MHz)
f=operating frequency (500 MHz)
The waveguide "b" dimension is given by:

$$b = c/(2*f_c) = 0.425 \text{ meters} \qquad (2)$$

where:
b="b" dimension of the waveguide
c=speed of light (3E8 meters/sec)
The waveguide "a" dimension is selected as 0.05 meters which is a factor related to the operating voltage and power level. The peak operating voltage of the E-beam is selected as 500 kV. The maximum peak current density of the E-beam is limited by the space-charge (Child-Langmuir) effect to:

$$Jeb = 2.34E - 6*Veb^{3/2}/(a*a) = 330,900 \text{ amps/sqm} \qquad (3)$$

where
Jeb=E-beam current density (amps/sq m)
Veb=E-beam voltage (500 kV)
a="a" dimension of the waveguide (0.05 m)
The thickness (s) of the sheet beam is selected as one tenth of a wavelength or 0.06 meters, this determines the sheet current density as:

$$Js = Jeb*s = 19,854 \text{ amps/m} \qquad (4)$$

The electric RF field Ex and RF power are determined by:

$$Ex = Js*Zo/2 = 4.3 \text{ (MV/m)} \qquad (5)$$

$$P = Ex*Ex*a*b/(2*Zo) = 450 \text{ MW} \qquad (6)$$

The E-beam input power is given by:
$$Peb = Js*Veb*b/\pi = 1.33 \text{ GW} \qquad (7)$$

The efficiency of conversion of E-beam energy to RF is thus 33.8% which means that the beam dump 120 in FIG. 1 must handle a dissipation of 880 MW. If the pulse duration is 5 microseconds, the RF output energy is 2259 joules and the beam dump energy is 4400 joules.

FIG. 2 in the drawings shows a graphical representation of waveforms attending the sheet electron beam energy to waveguide TE mode energy conversion in the waveguide 122—waveforms occurring in response to the electron beam 114. In FIG. 2 the vertical coordinate 208 represents signal amplitude while the horizontal axis 210 represents time and the pulses 200 represent the grid modulated energy originating in the electron beam 114 of FIG. 1. As is indicated by the pulses 202, a part of the radio frequency energy generated by the electron beam travels toward the right hand end portion of the waveguide 122 in FIG. 1 in starting synchronism with the electron beam pulses 200. As indicated by the pulses 204, another part of the $TE_{01}$ energy travels toward the left in FIG. 1 and is inverted and shifted in time phase so as to occupy the vacant lower half pulse spaces of the waveform 202 to provide a complete sinusoid for the radio frequency energy waveform as is shown at 206.

One apparatus that is suitable for use as the gridded source of the electron beam 114 in FIG. 1, that is an electron source for the electron beam gun apparatus 106 in FIG. 1 is the gated field emitter cathode apparatus described in the above referred to IEEE article titled "Gigatron" and in the therein referred-to technical articles of C. A. Spindt et al, "Field Emission Array Development", published in the proceedings of the thirty-third International Field Emission Symposium 1986, the article of D. J. Campisi and H. Gray, "Microfabrication of Field Emission Devices for Vacuum Integrated Circuits Using Orientation Dependent Etching", appearing in proceedings of the Material Research Society Meeting, 1986. The contents of these journal articles are also incorporated by reference herein.

In the Spindt et al structure, an n-doped silicon substrate is used to receive an array of metal point cathodes of about one micrometer dimension with the cathodes being placed on five to ten micrometer centers and each being surrounded by silicon dioxide dielectric material and by a metal gate film structure. Arrays of this type have provided beam currents in the range above 250 amperes per square centimeter. A set of grid control characteristics for devices of this type is shown in the herein incorporated by reference "Gigatron" article and additional characteristics are described in the published paper of Spindt et al.

Figure 3:
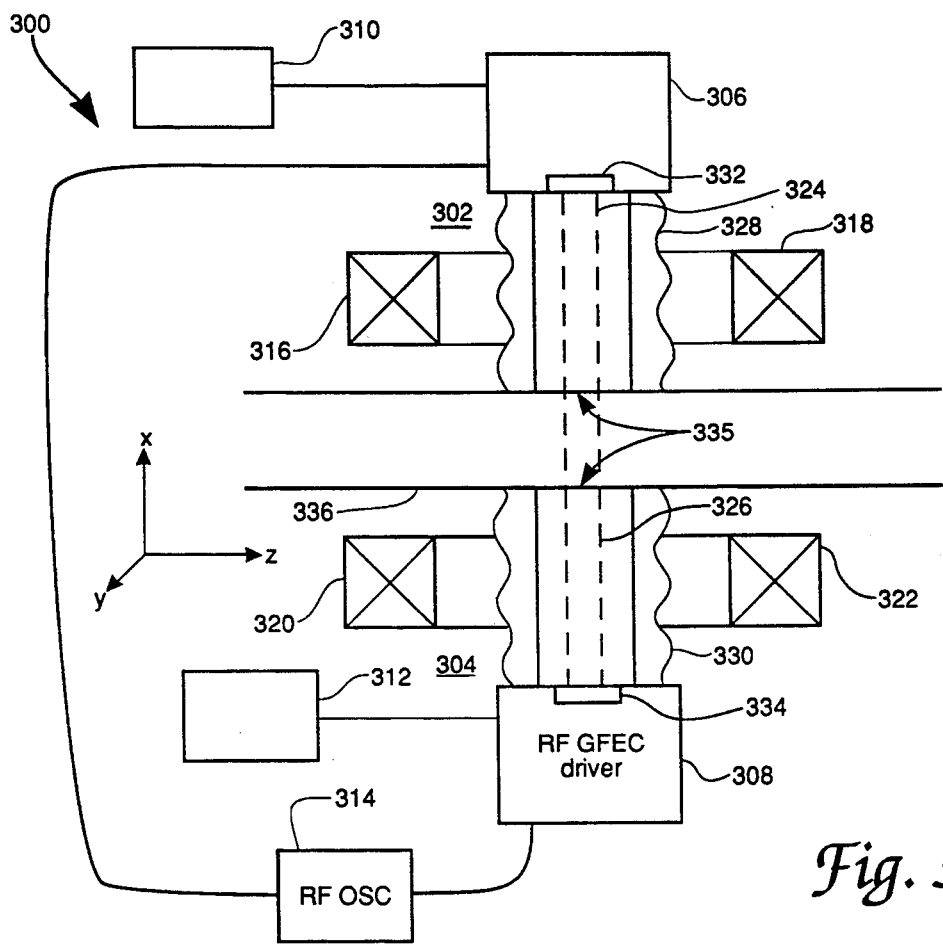
FIG. 3 shows an alternate microwave energy source apparatus according to the invention.

FIG. 3 in the drawings shows another arrangement of a microwave energy generating apparatus according to the invention. In the FIG. 3 microwave generating apparatus 300 are included two electron beam generators 302 and 304 which are each similar to the gun apparatus 106 described for the FIG. 1 embodiment of the invention. The FIG. 3 generators include the electron sources 332 and 334 that are driven by the driver circuits 306 and 308 which are in turn controlled by the radio frequency oscillator 314 through the previously recited fiber optic coupling link. Energy imparted to the sheet electron beams 324 and 326 in the FIG. 3 apparatus originates in the video pulser circuits 310 and 312 which are similar to the power supply and bypass capacitor in the FIG. 1 apparatus. A pair of electron beam windows 335 are shown disposed in the waveguide member 336 in FIG. 3 and the vacuum enclosure structures 328 and 330 are shown to surround the electron beam path between the driver circuits 306 and 308 and the waveguide 336.

Additionally shown in FIG. 3 are a pair of beam quality improvement magnetic coils which include the cross-sectional structures 316–318 and 320–322 in FIG. 3 and surround a portion of the vacuum enclosure structures 328 and 330.

In the FIG. 3 arrangement of the invention, two shaped electron beams are injected into the x-y plane within the waveguide 336 in opposite z-axis directions. Each of these beams is sine tapered in the y-axis direction and is a half sine time wave 180 degrees out of phase with respect to the other beam. Thus, the ultimate current sheet is sinusoidal in time and sine tapered across the wide dimension of the waveguide. Elementary electromagnetic waveguide theory can be used to show that a current sheet of this double sinusoid characteristic is, in fact, the source of Z+ and Z− $TE_{01}$ waves-using the mathematical relationships presented in Appendix A hereof.

In the FIG. 3 microwave source, the power flowing in each direction is given by:

$$P/2 = Ex^* Ex^* a^* b/(2^* Z_o) = Jo^* Jo^* Z_o^* a^* b/8 \text{ watts} \quad (8)$$

where:
P = total RF power, both directions in watts
a = X dimension of waveguide in meters
b = Y dimensions of waveguide in meters
Zo = characteristic impedance of waveguide in ohms
Jo = peak current density of the sheet in amps per meter $$Jx(y) = Jo^* Sin(\pi^* y/b)$$

$$Ex = E \text{ field intensity} = Jo^* Zo/2 \text{ in volts/meter}$$

With the directly opposed configuration of the electron guns shown in FIG. 3, it is possible to omit the shorted waveguide reflection node shown at 118 in FIG. 1 and to displace the occurrence of the electron beams 324 and 326 to differing time locations in order to form the positive and negative halves of the radio frequency sine wave output. Such timewise displacement of the electron beams 324 and 326 may be accomplished by suitable timing adjustment of the two signals generated by the radio frequency oscillator 314 and the video pulsing circuit 310 and 312. With this arrangement, radio frequency waves of equal power will flow in both directions outwardly from the electron beam.

At lower energy levels, the microwave generating apparatus of FIG. 3 provides desirable operating characteristics. However, at higher levels, the directly opposite placement of electron guns as shown in FIG. 3 is subject to practical limitations because the guns fire directly at each other and can therefore be damaging to each other. The FIG. 4 microwave energy source shows one arrangement for overcoming this difficulty. In the FIG. 4 microwave source, the two electron beams 400 and 402 are shown to be located at physically displaced points along the waveguide 410, this displacement 404 being for a distance of ¼ wavelength at the waveguide operating microwave frequency. The beam dump devices 406 and 408 provide for dissipation of electron beam energy that is not converted into microwave energy in the FIG. 4 apparatus. The additional magnetic field generating coils represented by the cross sections 412,414 and 413,415 and by the cross sections 416,418 and 417,419 in the FIG. 4 apparatus serve to guide and confine the electron beams 402 and 400, respectively.

Figure 4:
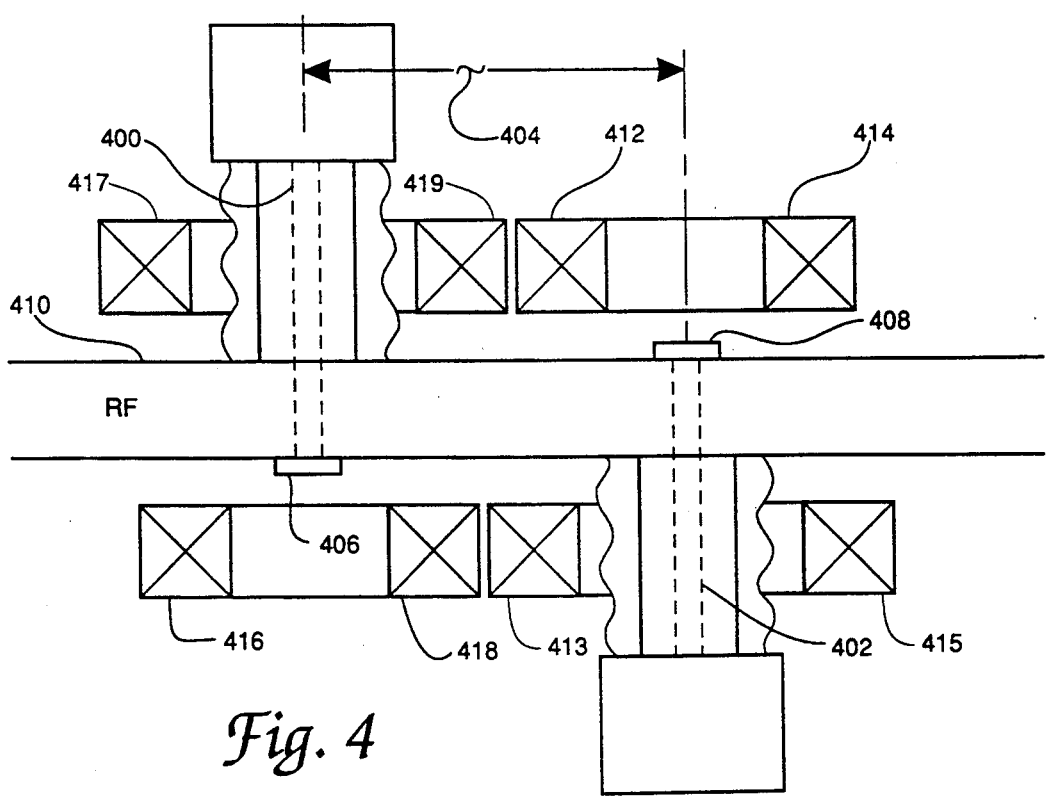
FIG. 4 shows a second alternate microwave energy source apparatus according to the invention.

In the FIG. 4 microwave source arrangement, it is desirable for the grid drive phasing to be adjusted so that the radio frequency energy from each sheet beam will combine with the same result as if the sources were singular and bi-polar as in the configuration of FIG. 3. In the FIG. 4 arrangement, the electron guns are preferably modulated to produce half sine wave electron beams of opposite polarity. The radio frequency fields generated by these beams are also of opposite polarity and as a result of the half wavelength spacing, combine to produce a resultant radio frequency wave that is bi-polar at the selected frequency.

The single electron gun beam arrangement shown in FIG. 1 of the drawings is, of course, devoid of the opposed electron beam gun arrangement of FIG. 3. The FIG. 3 opposed electron gun arrangement, notwithstanding its high energy level opposed gun location disadvantages, has the desirable feature of providing a broad instantaneous bandwidth capability (a bandwidth on the order of 10 percent as compared to other high-power devices with bandwidths typically on the order of two percent) for the output microwave signal. Since both the spaced electron beam gun arrangement of FIG. 4 and the single electron beam gun arrangement of FIG. 1 require use of fixed mechanical dimensions, that is, wavelength fractional dimensions, the instantaneous operating bandwidth of these two arrangements is limited to values of about 10 percent in order that the higher operating efficiencies be achieved.

Figure 5:
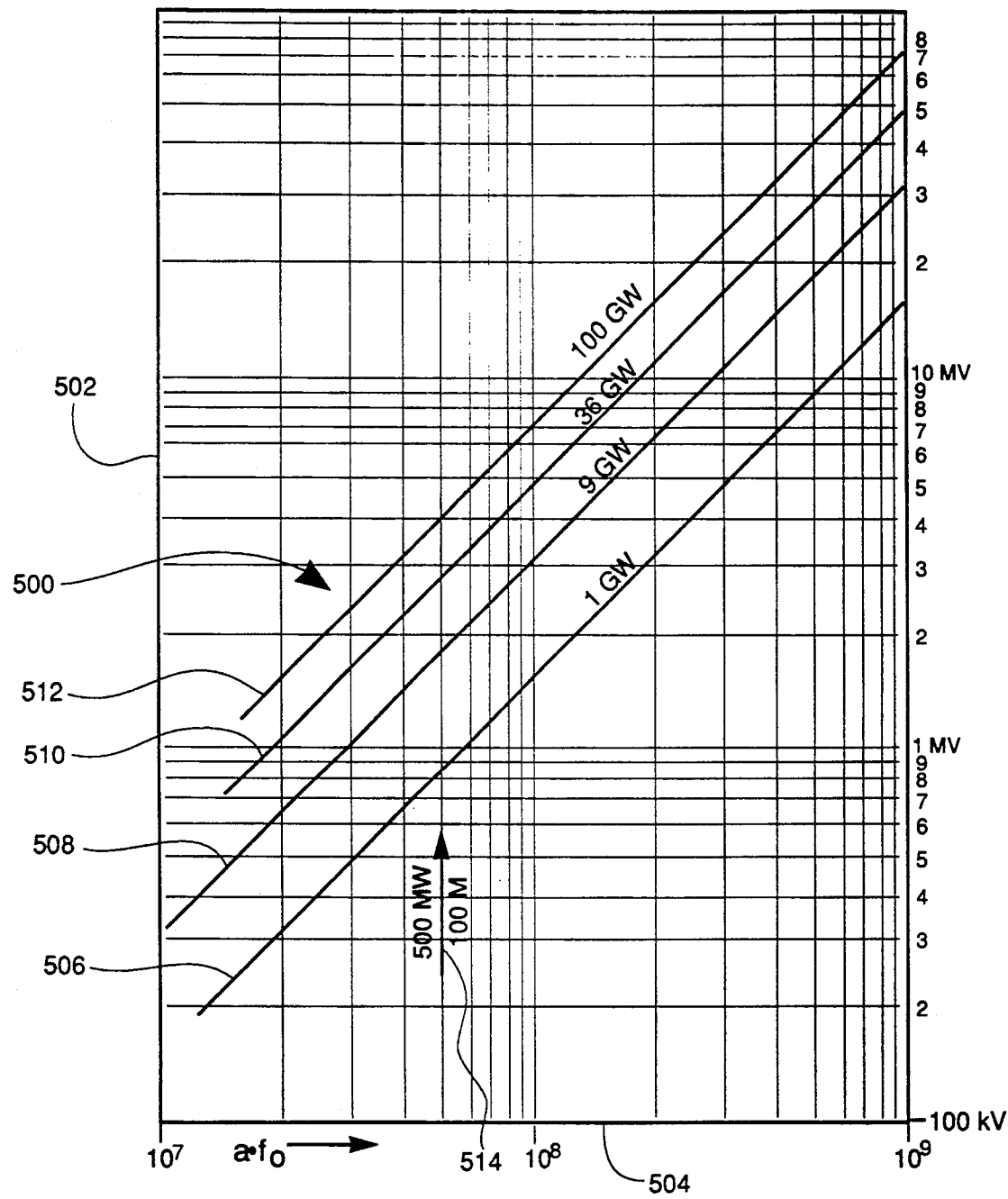
FIG. 5 shows the relationship between electron beam voltage and radio frequency power output over a range of operating apparatus according to the invention.

FIG. 5 of the drawings shows a family of curves 500 which may be used to predict the voltage required to achieve a desired peak power level in apparatus of the presently disclosed type. In the FIG. 5 diagram, voltages are plotted on the vertical scale 502 with values between 100 kilovolts and 100 megavolts being shown. A normalized set of values which are the product of operating frequency and waveguide height dimension "a" for a rectangular waveguide are shown on the horizontal axis 504. The four curves 506, 508, 510, and 512 in FIG. 5 represent power levels of one gigawatt, nine gigawatts, thirty-six gigawatts, and one hundred gigawatts respectively in the waveguide.

By way of example, the arrow 514 in FIG. 5 indicates that for an operating frequency of 500 megahertz and a rectangular waveguide ten centimeters in height, a one gigawatt power level requires about 80 kilovolts of electron beam energy while a power of level 100 gigawatts would require about four megavolts of electron beam energy. The FIG. 5 curves therefore relate the considerations of electron beam voltage, theoretical efficiency, waveguide dimension factors and operating frequency in relationship to operating power output levels. The waveguide dimensions presumed in FIG. 5 are less than one quarter wavelength.

Figure 6:
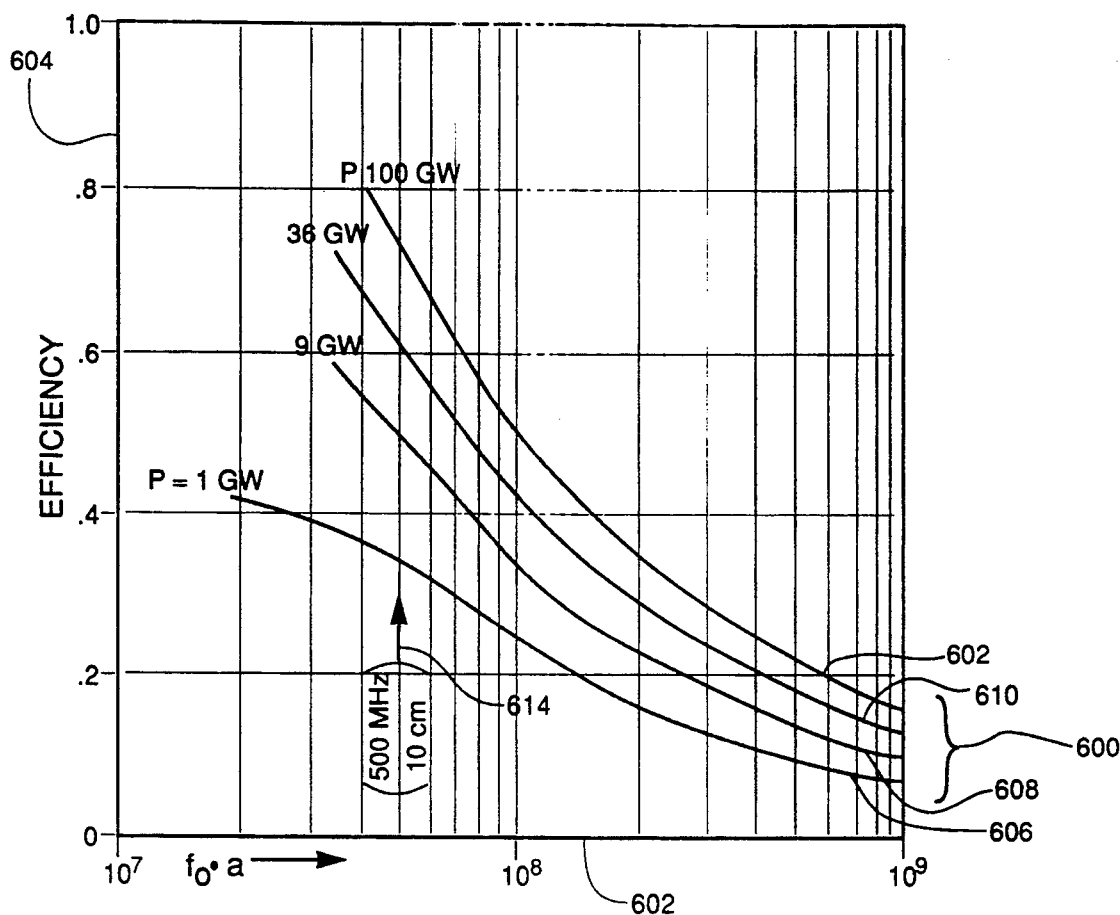
FIG. 6 shows a family of efficiency curves for different power output levels in a microwave energy source according to the invention.

FIG. 6 of the drawings shows another family of curves 600 which relate theoretical efficiency, that is, the ratio of output radio frequency power to beam input power for differing operating power levels, to the same normalized product of waveguide dimension and operating frequency used along the horizontal axis 504 in FIG. 5. In the FIG. 6 family 600, the curve 606 represents an operating power level of one gigawatt, the curve 608 power level of 9 gigawatts, the curve 610 an output power level of 36 gigawatts, and the curve 612 a power level of 100 gigawatts. The arrow 614 in FIG. 6 indicates a typical set of operating frequency and waveguide dimensional values, the same 500 megahertz and ten centimeter values employed in FIG. 5, and values along the vertical scale 604 represent efficiency between zero and one hundred percent. As is indicated by the general shape of the curves in the family 600, better theoretical operating efficiencies are to be expected when lower frequencies, larger waveguide dimensions, and higher output power levels are involved. As indicated by values along the arrow 614, operating efficiencies from just under 40% to just under 80% are achievable with typical arrangements of the disclosed invention.

Figure 7:
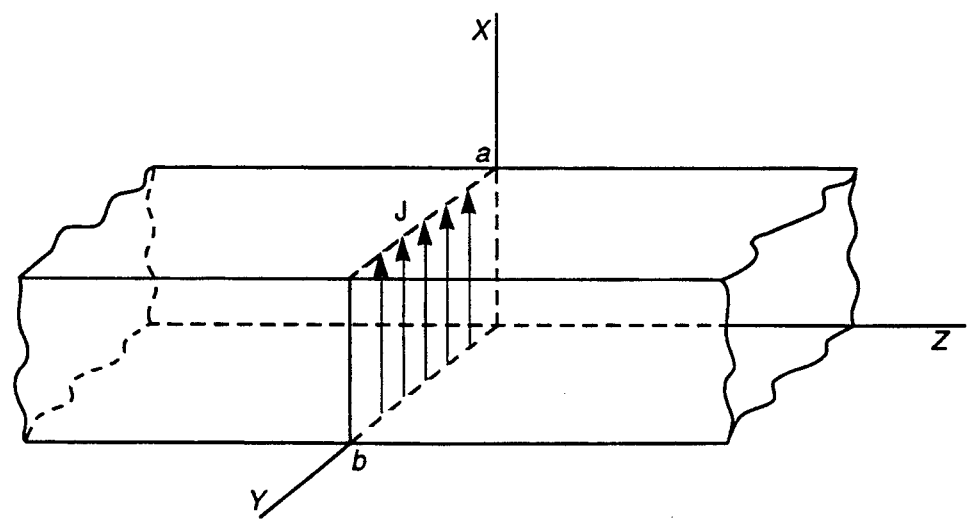
FIG. 7 shows symbols and spatial relations for appendix A discussed sheet current in a rectangular waveguide.

FIG. 7 in the drawings shows the coordinate directions, rectangular waveguide dimension variables, a and b, and the electric field indicating vectors which are presumed in the equations and the other descriptive material of the present documents. The conventions shown in FIG. 7 are particularly applicable to the equations of Appendix A herein which were referred to in connection with the description attending FIG. 1.

The present invention therefore provides for the generation of higher level microwave radio frequency power while achieving higher efficiency and larger bandwidth than is available in currently utilized apparatus. Uses of this capability in military weapons and military and commercial communications apparatus are feasible. Both the simplicity and the capability for order of magnitude greater power levels than in previously utilized apparatus enhance the utility of the described apparatus.

While the apparatus and method herein described constitute a preferred embodiment of the invention, it is to be understood that the invention is not limited to this precise form of apparatus or method and that changes may be made therein without departing from the scope of the invention which is defined in the appended claims.

APPENDIX A
TE Fields Generated by Sheet Current Source in Rectangular WG

Note: The drawing of FIG. 7 shows symbols and spatial relationships pertaining to the following discussion.

$$\left.\begin{array}{l} E_x^- = B \sin \frac{\pi y}{b} e^{j\beta z} \\ H_y^- = -\frac{B}{Z_0} \sin \frac{\pi y}{b} e^{j\beta z} \\ H_z^- = \frac{B}{j\eta} \frac{f}{f_e} \cos \frac{\pi y}{b} e^{j\beta z} \end{array}\right\} z < 0$$

$$\left.\begin{array}{l} E_x^+ = A \sin \frac{\pi y}{b} e^{-j\beta z} \\ H_y^+ = \frac{A}{Z_0} \sin \frac{\pi y}{b} e^{-j\beta z} \\ H_z^+ = \frac{A}{j\eta} \frac{f}{f_e} \cos \frac{\pi y}{b} e^{-j\beta z} \end{array}\right\} z > 0$$

TE01 Fields Propagating in $Z-$ and $Z+$ Directions $$-u_x[H_y^+ - H_y^-]_{z=0} = J_z \quad [E_x^+ - E_x^-]_{z=0} = 0$$

$$-u_x \frac{A + B}{Z_0} \sin \frac{\pi y}{b} = J_z \quad A - B = 0$$

$$J_z = u_x J_0 \sin \frac{\pi y}{b}$$

Equations of Field Continuity at Source $$E_x = \begin{cases} -\frac{J_0 Z_0}{2} \sin \frac{\pi y}{b} e^{-j\beta z} & z > 0 \\ -\frac{J_0 Z_0}{2} \sin \frac{\pi y}{b} e^{j\beta z} & z < 0 \end{cases}$$

$E_x$ Field as Function of Sheet Current Source

I claim:
1. Microwave energy generation apparatus comprising:
   means for generating a high energy level sheet electron beam of predetermined lateral density profile;
   means for timewise additionally varying the electron density of said laterally profiled sheet electron beam in response to a time-dependent pulse modulation signal;
   microwave waveguide means including a reflection node short circuit portion and input port means disposed in predetermined separation therefrom for receiving said profiled and pulse modulated sheet electron beam thereinto;
   said waveguide means emitting sheet electron beam sourced microwave radio frequency energy having waveform components received directly from said input port means and also via said reflection node short circuit portion, from said input port means.
2. The microwave energy generation apparatus of claim 1 wherein said sheet electron beam predetermined lateral electron density comprises a waveguide TE01 mode generating half sinusoid pulse density function.
3. The microwave energy generation apparatus of claim 2 wherein said means for timewise additionally varying the density of said sheet electron beam includes a control grid member.
4. The microwave energy generation apparatus of claim 3 wherein said means for generating a high energy level sheet electron beam includes a thermionic cathode apparatus.

5. The microwave energy generation apparatus of claim 3 wherein said means for generating a high energy level sheet electron beam includes a grid controlled thin film solid state field emission array.

6. The microwave energy generation apparatus of claim 2 further including magnetic flux generating means for shaping said sheet electron beam.

7. The microwave energy generation apparatus of claim 2 wherein said waveguide means short circuit portion to input port means predetermined separation comprises a distance of one quarter wavelength.

8. The microwave energy generation apparatus of claim 1 wherein said time-dependent pulse modulation signal also has a half sinusoid pulse shape.

9. The microwave energy generation apparatus of claim 1 wherein said means for generating a high energy level sheet electron beam includes a plurality of electron beam generating devices disposed at plural locations along said microwave waveguide means.

10. The microwave energy generation apparatus of claim 9 wherein said disposition includes physical displacement of one half wavelength.

11. The microwave energy generation apparatus of claim 2 further including vacuum tight closure means for holding portions of said waveguide means and means enclosing said sheet electron beam at pressures below atmosphere.

12. The microwave energy generation apparatus of claim 11 further including electron beam energy absorbing and dissipating means disposed in said waveguide means opposite said input port means for dissipating non-microwave energy converted portions of said electron beam energy.

13. The microwave energy generation apparatus of claim 7 wherein said predetermined separation comprises an odd number multiple of one quarter wavelength.

14. The microwave energy generation apparatus of claim 13 wherein said plurality of one half wavelength displaced electron beam generating devices include modulation means for generating half sine wave electron beam pulses of opposite polarity.

15. The method for generating coherent microwave energy comprising the steps of:
  forming a laterally dispersed high energy level sheet electron beam of predetermined electron density profile along the lateral dispersion;
  modulating said sheet electron beam with a timedependent pulse modulation function of predetermined envelope shape;
  converting the energy of said pulse modulated laterally profiled sheet electron bean into waveguide resident $TE_{01}$ mode first pulses of electromagnetic energy;
  filling the time intervals between pulses of said $TE_{01}$ mode electromagnetic energy within said waveguide with polarity opposed pulses of $TE_{01}$ mode energy that are waveform correlated with said first pulses to compose a sinusoid.

16. The method of claim 15 wherein said polarity opposed pulses are also sourced in said sheet electron beam and reflected from a short circuit energy reflecting and polarity reversing node portion of said waveguide.

17. The method of claim 15 wherein said pulse modulation function has a period equal to that of the output microwave energy from said waveguide.

18. The method of claim 15 wherein said predetermined electron density profile is sinusoidal in distribution and thereby substantially correlated with said waveguide TE01 mode energy.

19. The method of claim 15 wherein said timedependent pulse modulation function envelope shape comprises a sinusoid.

20. The method of claim 15 wherein said converting step includes receiving said sheet electron beam as an energy radiating antenna within a predetermined portion of said waveguide.

* * * * *